US012627285B2

(12) United States Patent
Wang

(10) Patent No.: US 12,627,285 B2
(45) Date of Patent: May 12, 2026

(54) ELECTRONIC CIRCUIT OPTIMIZING TIMING OF CLOCK SIGNALS AND DATA SIGNALS AND DELAY METHOD THEREOF

(71) Applicant: Nuvoton Technology Corporation, Hsinchu Science Park (TW)

(72) Inventor: Cheng-Chih Wang, Jhubei City (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 112 days.

(21) Appl. No.: 18/829,714

(22) Filed: Sep. 10, 2024

(65) Prior Publication Data

US 2025/0233582 A1     Jul. 17, 2025

(30) Foreign Application Priority Data

Jan. 17, 2024    (TW) ................................. 113101785

(51) Int. Cl.
H03K 5/00         (2006.01)
H03K 5/133        (2014.01)
H03K 5/135        (2006.01)

(52) U.S. Cl.
CPC ............. *H03K 5/133* (2013.01); *H03K 5/135* (2013.01)

(58) Field of Classification Search
CPC ........... G11C 7/06; G11C 7/10; G06F 1/3206; G06F 1/3275; H03K 5/133; H03K 5/135
See application file for complete search history.

(56) References Cited

U.S. PATENT DOCUMENTS

| | | | |
|---|---|---|---|
| 2005/0146980 A1* | 7/2005 | Mooney ............... | G11C 7/1066 365/233.1 |
| 2008/0008283 A1* | 1/2008 | Lee ......................... | H04L 25/02 375/375 |
| 2019/0097637 A1* | 3/2019 | Hutton ..................... | H03L 7/08 |
| 2021/0399722 A1* | 12/2021 | Hamdan ................ | H03L 7/081 |

* cited by examiner

*Primary Examiner* — Tuan T Lam
(74) *Attorney, Agent, or Firm* — MUNCY, GEISSLER, OLDS & LOWE, P.C.

(57) ABSTRACT

An electronic circuit applied to communication between a controller and a memory array includes a timer and a delay-locked loop. The timer counts a counting time based on a selection signal generated by the controller to generate a first enable signal. The delay-locked loop delays an output clock signal by a delay time based on a clock signal generated by the controller and the first enable signal to generate the delay clock signal. When the controller performs a read operation on the memory array, the memory array outputs the output clock signal and a data signal. The controller samples the data signal using the delay clock signal.

20 Claims, 8 Drawing Sheets

300

700

800

ELECTRONIC CIRCUIT OPTIMIZING TIMING OF CLOCK SIGNALS AND DATA SIGNALS AND DELAY METHOD THEREOF

CROSS REFERENCE TO RELATED APPLICATIONS

This application claims priority of Taiwan Patent Application No. 113101785, filed on Jan. 17, 2024, the entirety of which is incorporated by reference herein.

BACKGROUND OF THE INVENTION

Field of the Invention

The disclosure is generally related to an electronic circuit suitable for a memory and a delay method for the memory, and more particularly it is related to an electronic circuit that optimizes the timing of clock signals and data signals generated by a memory array and a delay method thereof.

Description of the Related Art

In recent years, edge computing and artificial intelligence have gradually become the mainstream of the market. In addition to more powerful microprocessors (MCU/MPU), people's requirements for storage products have become increasingly stringent. Compared with a traditional virtual static random access memory (Pseudo SRAM, pSRAM), a new type of memory called HyperRAM has begun to be used, especially in the Internet of Things and consumer devices. Due to its ultra-low power consumption, simple design, and easy control, HyperRAM thrives in automotive and industrial applications.

HyperRAM uses a bus called HyperBus for transmission. HyperBus uses a high-speed 8-bit transmission interface for both address and data. In addition, differential clock signals, read/write latch signals, and chip select units are used for each memory element. HyperBus supports external flash memory and random access memory on the same bus and is suitable for any microcontroller with a HyperBus-compatible peripheral interface.

When reading the memory array, the microprocessor latches the data signal (i.e., DQ[7:0]) information. Since HyperBus is a double data rate (DDR) transmission interface, it is necessary to delay the clock signal of the bidirectional read/write data strobe signal so that the rising and falling edges of the clock signal are aligned with the center of the data signal to obtain the correct sampling value.

BRIEF SUMMARY OF THE INVENTION

For solving above problems, the present invention proposes an electronic circuit and a delay method. Through the electronic circuit and the delay method proposed by the present invention, the midpoint of the data signal of the memory array is aligned with the rising edge or the falling edge of the output clock signal (i.e., RWDS) to improve the accuracy of controller sampling. In addition, the electronic circuit and the delay method proposed by the present invention further count the counting time. When the electronic circuit times out, the electronic circuit enters a low-power state or even stops operating, thereby minimizing power loss as much as possible.

In an embodiment, an electronic circuit applied to communication between a controller and a memory array is provided. The electronic circuit comprises a timer and a delay-locked loop. The timer is configured to count a counting time based on a selection signal generated by the controller to generate a first enable signal. The delay-locked loop is configured to delay an output clock signal by a delay time based on a clock signal generated by the controller and the first enable signal to generate the delay clock signal. When the controller performs a read operation on the memory array, the memory array outputs the output clock signal and a data signal. The controller samples the data signal using the delay clock signal. Power-consuming states of the delay-locked loop are switched based on the first enable signal.

According to an embodiment of the present invention, the delay-locked loop comprises a first logic unit, a loop filter, a charge pump, a phase comparator, and a first delay chain. The first logic unit is configured output the clock signal as a reference clock signal based on the first enable signal being in an enable state. The loop filter generates a control voltage. The charge pump is configured to charge and discharge the loop filter based on a control signal. The phase comparator is configured to compare phases of the reference clock signal and a first internal delay signal to generate the control signal. The first delay chain has a predetermined number of delay cells and delays the reference clock signal based on the control voltage to generate the first internal delay signal.

According to an embodiment of the present invention, the delay-locked loop comprises a second delay chain and a multiplexer. The second delay chain has the predetermined number of delay cells and delays the output clock signal by the delay time to generate a second internal delay signal. The multiplexer is configured to select one of the output signals output by the predetermined number of delay cells as the delay clock signal.

According to an embodiment of the present invention, the first delay chain delays the reference clock signal by the delay time to generate the first internal delay signal. The reference clock signal has a cycle period. The delay time is equal to the cycle period.

According to an embodiment of the present invention, when a phase of the reference clock signal is equal to a phase of the first internal delay signal, the phase comparator generates a lock signal. The controller determines, based on the lock signal, that the phase of the reference clock signal is equal to the phase of the first internal delay signal, and samples the data signal based on the delay clock signal.

According to an embodiment of the present invention, when the first enable signal is in a disable state, the first logic unit does not output the reference clock signal. When the first enable signal is in the enable state, the first logic unit outputs the clock signal as the reference clock signal. The delay-locked loop operates in a high power state based on the first enable signal being in the enable state.

According to an embodiment of the present invention, when the first enable signal is in the disable state, the delay-locked loop is not being powered. The delay-locked loop operates in a first low-power state based on the first enable signal being in the disable state. The power consumption of the delay-locked loop operating in the high power state exceeds the power consumption of the delay-locked loop operating in the first low-power state.

According to an embodiment of the present invention, when the selection signal is transitioned from a first logic level to a second logic level, the communication between the controller and the memory array begins, the first enable signal is in the enable state, and the timer resets the counting time.

According to an embodiment of the present invention, when the selection signal is transitioned from the second logic level to the first logic level, the timer begins counting the counting time. When the counting time reaches a first target time, the timer sets the first enable signal to be in the disable state. The delay-locked loop is disabled based on the first enable signal being in the disable state.

According to an embodiment of the present invention, the timer further counts the counting time based on an additional clock signal.

According to another embodiment of the present invention, the delay-locked loop comprises a second logic unit. The second logic unit is configured to perform a logic operation on the first enable signal and a second enable signal to generate a third enable signal. The first logic unit further generates the reference clock signal based on the third enable signal.

According to an embodiment of the present invention, when the first enable signal and the second enable signal are both in the enable state, the first logic unit outputs the clock signal as the reference clock signal. When the first enable signal or the second enable signal is in the disable state, the first logic unit does not output the reference clock signal.

According to an embodiment of the present invention, the delay-locked loop comprises a third logic unit. The third logic unit is configured to generate a hold signal based on the first enable signal and the second enable signal. When the first enable signal is in the disable state and the second enable signal is in an enable state, the hold signal is in a turn-off state. When the first enable signal and the second enable signal are both in the enable state or the disable state, the hold signal is in a turn-on state. The delay-locked loop operates in a second low-power state based on the hold signal being in the turn-off state. The power consumption of the delay-locked loop operating in the second low-power state is between the power consumption of delay-locked loop operating in the high power state and the power consumption of the delay-locked loop operating in the first low-power state.

According to an embodiment of the present invention, the loop filter comprises a resistor, a capacitor, and a switch. The resistor is coupled to the charge pump. The capacitor is coupled between the control voltage and a ground. The switch is coupled between the resistor and the capacitor and controlled by the hold signal.

According to an embodiment of the present invention, when the hold signal is in the turn-off state, the switch is turned off and the capacitor is configured to hold the control voltage. When the hold signal is in the turn-on state, the switch is turned on.

In another embodiment, a delay method applied to an electronic circuit is provided. The electronic circuit is applied to communication between a controller and a memory array. The delay method comprises the following steps. It is determined whether a selection signal is in an enable state or a disable state. When the selection signal is in the enable state, an output clock signal of the memory array is received. The output clock signal is delayed by a delay time to generate a delay clock signal using a delay-locked loop. Data in a data signal is aligned with a rising edge or a falling edge of the delay clock signal. The controller samples the data signal based on the delay clock signal.

According to an embodiment of the present invention, the delay method further comprises the following steps. When the selection signal is in the disable state, the counting time is counted. It is determined whether the counting time reaches a first target time. When the counting time reaches the first target time, the delay clock signal is not output, and it continues to determine whether the selection signal is in the enable state or the disable state. When the counting time has not reached the first target time, it continues to count the counting time and continues to delay the output clock signal by the delay time to generate the delay clock signal using the delay-locked loop.

According to an embodiment of the present invention, the delay method further comprises the following steps. When the selection signal is in the enable state, the counting time is reset.

According to another embodiment of the present invention, the delay-locked loop further comprises a capacitor to store a control voltage. The delay-locked loop delays the output clock signal by the delay time to generate the delay clock signal based on the control voltage.

According to an embodiment of the present invention, the delay method further comprises the following steps. When the counting time reaches the first target time, the control voltage is held by the capacitor to keep outputting the delay clock signal and to reduce power consumption. When the counting time reaches a second target time, the capacitor is discharged to stop outputting the delay clock signal. The second target time exceeds the first target time.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
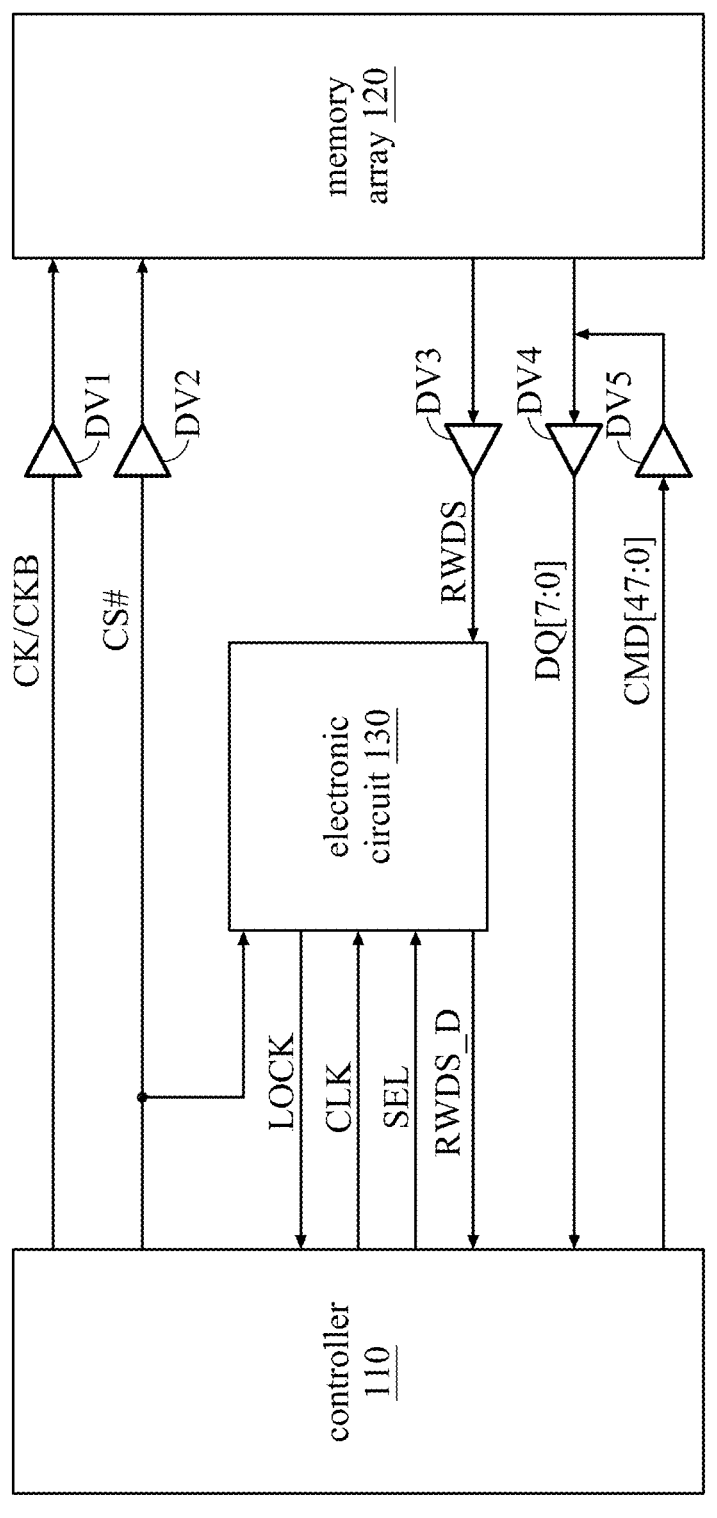
FIG. 1 is a schematic diagram showing an electronic device in accordance with an embodiment of the present invention.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In addition, in this specification, relative spatial expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "approximately", "about" and "substantially" typically mean a value is within a range of +/−20% of the stated value, more typically a range of +/−10%, +/−5%, +/−3%, +/−2%, +/−1% or +/−0.5% of the stated value. The stated value of the present disclosure is an approximate value. Even there is no specific description, the stated value still includes the meaning of "approximately", "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In the drawings, similar elements and/or features may have the same reference number. Various components of the same type can be distinguished by adding letters or numbers after the component symbol to distinguish similar components and/or similar features.

FIG. 1 is a schematic diagram showing an electronic device in accordance with an embodiment of the present invention. As shown in FIG. 1, the electronic device 100 includes a controller 110, a memory array 120, and an electronic circuit 130. According to an embodiment of the present invention, the controller 110 may be a microprocessor. According to some embodiments of the present invention, the controller 110 and the memory array 120 communicate through a HyperBus transmission interface.

According to an embodiment of the present invention, as shown in FIG. 1, when the controller 110 performs a read operation on the memory array 120, the controller 110 provides the selection signal CS #and the transmission clock signal CK/CKB, via the first driving circuit DV1 and the second driving circuit DV2 to the memory array 120 respectively, where the selection signal CS #is used to select the corresponding memory address for reading operation.

When the memory array 120 receives the selection signal CS #and the transmission clock signal CK/CKB, the memory array 120 sends the output clock signal RWDS and the data signal DQ[7:0] through the third driving circuit DV3 and the fourth driving circuit DV4. The controller 110 samples the data of the data signal DQ[7:0] based on the output clock signal RWDS. According to other embodiments of the present invention, the controller 110 further sends the operation command CMD[47:0] to the memory array 120 through the fifth driving circuit DV5.

Since there is some misalignment between the output clock signal RWDS and the data signal DQ[7:0], the electronic circuit 130 is used to generate an accurate delay time so that the controller 110 can sample the correct data. As shown in FIG. 1, the electronic circuit 130 is enabled based on the selection signal CS #. When the electronic circuit 130 is enabled, a lock signal LOCK is generated to notify the controller 110. The electronic circuit 130 delays the output clock signal RWDS based on the clock signal CLK and the delay selection signal SEL provided by the controller 110 to generate a delayed clock signal RWDS_D, so that the controller 110 can accurately utilize the delayed clock signal RWDS_D to sample the data of the data signal DQ[7:0].

Figure 2:
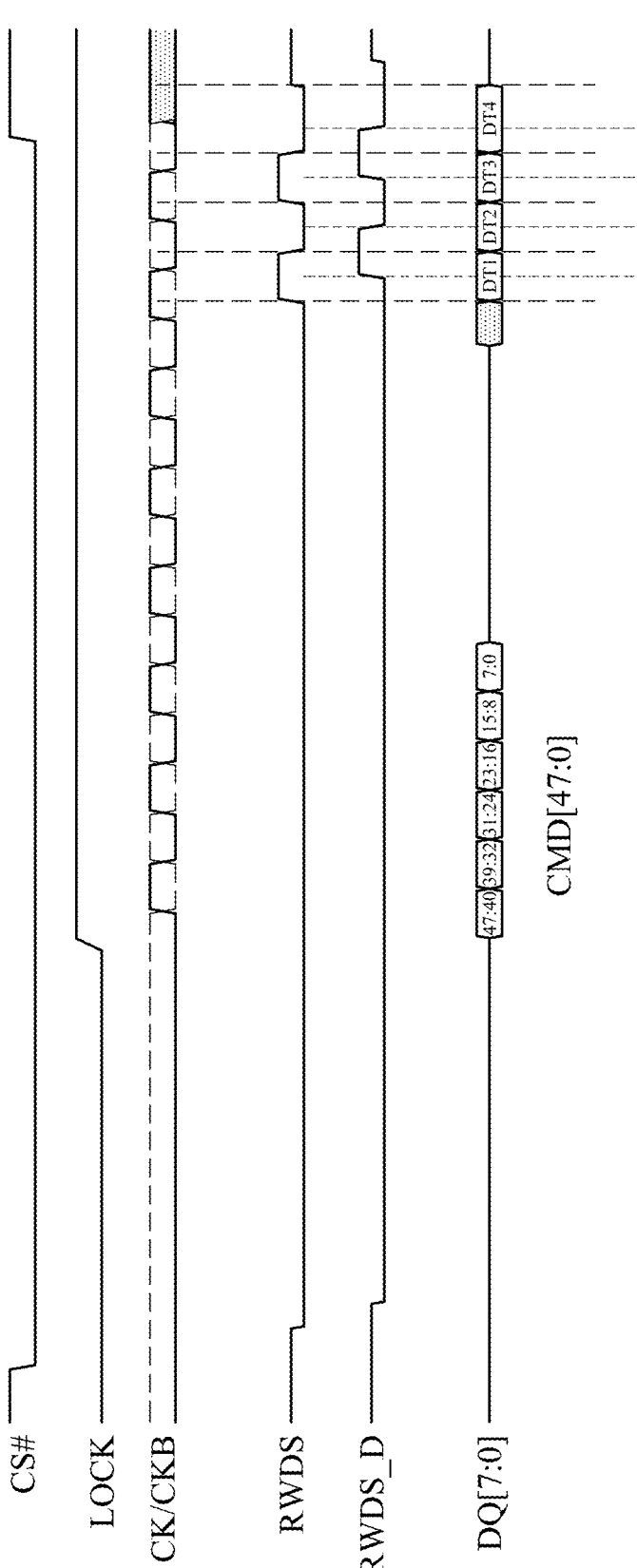
FIG. 2 shows a waveform diagram of an electronic device in accordance with an embodiment of the present invention.

FIG. 2 shows a waveform diagram of an electronic device in accordance with an embodiment of the present invention. The following description of FIG. 2 will be combined with FIG. 1 to facilitate detailed explanation. The following explanation will be based on that the selection signal CS #is enabled at a low logic level, but not intended to be limited thereto. As shown in FIG. 2, when the selection signal CS #switches from a high logic level to a low logic level, the controller 110 selects a specific memory address of the memory array 120 for the read operation, and simultaneously enables the electronic circuit 130.

When the electronic circuit 130 completes the initialization, the electronic circuit 130 converts the lock signal LOCK from a low logic level to a high logic level, and the controller 110 transmits the clock signal CK/CKB to the memory array 120 only after the lock signal LOCK is in the high logic level, and sends the operation command CMD [47:0] to the memory array 120 through the fifth driving circuit DV5. According to some embodiments of the present invention, as shown in FIG. 2, the operation command CMD[47:0] and the data signal DQ[7:0] share the same pin. In other words, the controller 110 transmits the operation command CMD[47:0] to the memory array 120 through the data signal DQ[7:0], and the memory array 120 transmits the first data DT1, the second data DT2, the third data DT3, and the fourth data DT4 through the data signal DQ[7:0].

As shown in FIG. 2, the rising edge and falling edge of the output clock signal RWDS output by the memory array 120 are respectively aligned with the starting points and the end points of the first data DT1, the second data DT2, the third data DT3, and the fourth data DT4. However, when the controller 110 samples the first data DT1, the second data DT2, the third data DT3, and the fourth data DT4, the best sampling timing points are located at the midpoint of the first data DT1, the second data DT2, the third data DT3, and the fourth data DT4.

Therefore, the electronic circuit 130 delays the output clock signal RWDS output by the memory array 120 by a delay time to generate a delayed clock signal RWDS_D, so that the rising edge and falling edge of the delayed clock signal RWDS_D are in line with the middle points of the first data DT1, the second data DT2, the third data DT3, and the fourth data DT4, respectively. Therefore, the controller 110 can accurately sample the first data DT1, the second data DT2, the third data DT3, and the fourth data DT4 of the data signal DQ[7:0] based on the rising edge and falling edge of the delayed clock signal RWDS_D.

According to some embodiments of the present invention, the electronic circuit 130 is used to adjust the delay time of the output clock signal RWDS, so that the intermediate points of the first data DT1, the second data DT2, the third data DT3, and the fourth data DT4 are respectively aligned with the rising edge and falling edge of the delayed clock signal RWDS_D. Hereinafter, how the electronic circuit 130 generates the delayed clock signal RWDS_D based on the output clock signal RWDS will be described in detail.

Figure 3:
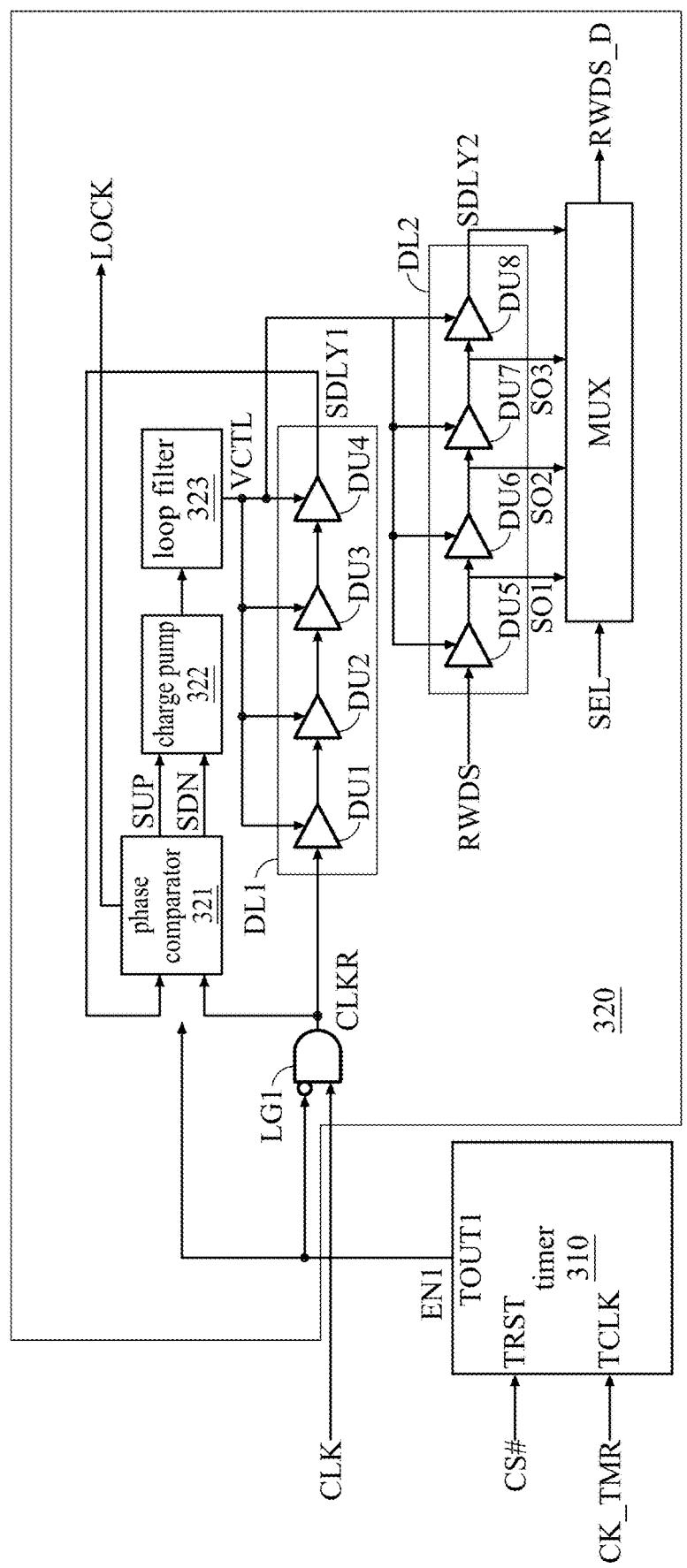
FIG. 3 is a schematic diagram showing an electronic circuit in accordance with an embodiment of the present invention.

FIG. 3 is a schematic diagram showing an electronic circuit in accordance with an embodiment of the present invention. According to an embodiment of the present invention, the electronic circuit 130 in FIG. 1 corresponds to the electronic circuit 300. As shown in FIG. 3, the electronic circuit 300 includes a timer 310 and a delay-locked loop 320.

The timer 310 is used to count the counting time, and includes a reset terminal TRST, a clock terminal TCLK, and a first output terminal TOUT1. The reset terminal TRST receives the selection signal CS #, and the clock terminal TCLK receives an additional timing clock signal CLK_TMR generated by the controller 110 (not shown in FIG. 1). The first output terminal TOUT1 generates the first enable signal EN1.

When the selection signal CS #is at the low logic level, the controller 110 starts to perform a read operation on the memory array 120, in which the timer 310, based on the selection signal CS #at a low logic level, zeros the counting time and outputs the first enable signal EN1 in the low logic level. When the selection signal CS #is at a high logic level, the controller 110 does not perform a read operation on the memory array 120.

At the same time, the timer 310 starts to count the counting time using the period of the timing clock signal CLK_TMR based on the selection signal CS #being at a high logic level. In other words, the timer 310 resets the counting time based on the selection signal CS #being at a low logic level, and starts counting the counting time based on the selection signal CS #being at a high logic level.

According to an embodiment of the present invention, when the counting time reaches the first target time, the first enable signal EN1 output by the timer 310 is at the high logic level. According to another embodiment of the present invention, when the counting time has not reached the first target time, the first enable signal EN1 output by the timer 310 is still at a low logic level.

The delay-locked loop 320 appropriately delays the output clock signal RWDS generated by the memory array 120 based on the clock signal CLK provided by the controller 110 in FIG. 1 and the first enable signal EN1 being at a low logic level to generate the delay time of the delay clock signal RWDS_D, so that the starting points and the end points of the first data DT1, the second data DT2, the third data DT3, and the fourth data DT4 provided by the memory array 120 through the data signal DQ[7:0] are aligned with the rising edge and falling edge of the delayed clock signal RWDS_D respectively.

As shown in FIG. 3, the delay-locked loop 320 includes a first logic unit LG1, a phase comparator 321, a charge pump 322, a loop filter 323, a first delay chain DL1, a second delay chain DL2 and a multiplexer MUX. The first logic unit LG1 outputs the clock signal CLK provided by the controller 110 in FIG. 1 as the reference clock signal CLKR based on the fact that the first enable signal EN1 is in the enable state. According to an embodiment of the present invention, since the low logic level enable is used for explanation herein, the first logic unit LG1 is illustrated as an AND gate. When the electronic circuit 300 is enabled by a high logic level, the first logic unit LG1 may be a combination of other logic gates.

According to an embodiment of the present invention, when the first enable signal EN1 is at a low logic level, the delay-locked loop 320 is enabled, so that the delay-locked loop 320 operates in the high power state. As shown in FIG. 3, when the first enable signal EN1 is at a low logic level, the first logic unit LG1 outputs the clock signal CLK as the reference clock signal CLKR. When the first enable signal EN1 is at a high logic level, the first logic unit LG1 stops outputting the reference clock signal CLKR.

Based on the fact that the first enable signal EN1 is in the enable state, the phase comparator 321 compares the phases of the reference clock signal CLKR and the first internal delay signal SDLY1 to generate a rising signal SUP and a falling signal SDN. According to an embodiment of the present invention, the rising signal SUP and the falling signal SDN are combined to form the control signal. In addition, when the phase of the reference clock signal CLKR is equal to the phase of the first internal delay signal SDLY1, the phase comparator 321 outputs the lock signal LOCK, so that the controller 110 knows that the electronic circuit 300 has been delay-locked.

The charge pump 322 charges and discharges the loop filter 323 based on the control signal which is a combination of the rising signal SUP and the falling signal SDN, thereby generating the control voltage VCTL. According to an embodiment of the present invention, when the first enable signal EN1 is in a disable state (i.e., a high logic level in the embodiment of FIG. 3), the phase comparator 321 is in a disable state, and the charge pump 322 discharges the control voltage VCTL. According to an embodiment of the present invention, when the first enable signal EN1 is in the disable state, the delay-locked loop 320 operates in the first low-power state, and the delay-locked loop 320 does not operate, where the power consumption of the delay-locked loop 320 operating in the first low-power state is less than the power consumption of the delay-locked loop 320 operating in the high power state.

As shown in FIG. 3, the first delay chain DL1 is formed by a first delay unit DU1, a second delay unit DU2, a third delay unit DU3, and a fourth delay unit DU4 electrically connected in series. In addition, each of the first delay unit DU1, the second delay unit DU2, the third delay unit DU3, and the fourth delay unit DU4 generates a delay based on the control voltage VCTL, so that the first delay chain DL1 delays the reference clock signal CLKR to generate the first internal delay signal SDLY1. According to an embodiment of the present invention, when the phase comparator 321 generates the lock signal LOCK, the phase of the reference clock signal CLKR is equal to the phase of the first internal delay signal SDLY1, and the first internal delay signal SDLY1 is generated by delaying the reference clock signal CLKR by one cycle period of the reference clock signal CLKR.

According to other embodiments of the present invention, the first delay chain DL1 may include any number of delay units. Here, four delay units are used for illustration and explanation, but not intended to be limited thereto in any form. In addition, when the first delay chain DL1 is composed of a larger number of delay units, the precision of the generated delay time will be higher. According to some embodiments of the present invention, the first delay chain DL1 may be composed of 16 delay units. According to other embodiments of the present invention, the first delay chain DL1 may be composed of 64 delay units.

As shown in FIG. 3, the second delay chain DL2 is formed by a fifth delay unit DU5, a sixth delay unit DU6, a seventh delay unit DU7, and an eighth delay unit DU8 electrically connected in series. In addition, each of the fifth delay unit DU5, the sixth delay unit DU6, the seventh delay unit DU7, and the eighth delay unit DU8 delays based on the control voltage VCTL, so that the second delay chain DL2 delays the output clock signal RWDS based on the control voltage VCTL to generate a second internal delay signal SDLY2.

According to some embodiments of the present invention, the number of delay units of the second delay chain DL2 is equal to the number of delay units of the first delay chain DL1, and the first delay unit DU1, the second delay unit DU2, the third delay unit DU3, the fourth delay unit DU4, the fifth delay unit DU5, the sixth delay unit DU6, the seventh delay unit DU7, and the eighth delay unit DU8 each has the same circuit structure.

Since both the first delay chain DL1 and the second delay chain DL2 delay the reference clock signal CLKR and the output clock signal RWDS based on the control voltage VCTL respectively, in addition, the first delay chain DL1 and the second delay chain DL2 have the same number of the delay units having the same circuit structure, the delay time from the output clock signal RWDS to the second internal delay signal SDLY2 is equal to the delay time from the reference clock signal CLKR to the first internal delay signal SDLY1. In other words, the delay time of the first delay chain DL1 is copied to the second delay chain DL2.

As shown in FIG. 3, the multiplexer MUX selects one of the first output signal SO1, the second output signal SO2, the third output signal SO3, and the second internal delay signal SDLY2 to output as a delayed clock signal RWDS_D based on the delay selection signal SEL output by the controller 110. In addition, the output signals of the fifth delay unit DU5, the sixth delay unit DU6, and the seventh delay unit DU7 are the first output signal SO1, the second output signal SO2, and the third output signal SO3 respectively.

According to an embodiment of the present invention, as shown in FIG. 2, when the selection signal CS #switches from a high logic level to a low logic level, the first enable signal EN1 is at a low logic level to enable the electronic circuit 300 to delay the output clock signal RWDS by a delay time, so as to generate a delayed clock signal RWDS_D. The controller 110 selects an appropriate delay time by the delay selection signal SEL to output one of the first output signal SO1, the second output signal SO2, and the third output signal SO3 and the second internal delay signal SDLY2 as the delayed clock signal RWDS_D.

In addition, when the selection signal CS #transitions from a high logic level to a low logic level, the timer 310 zeros the counting time. According to another embodiment of the present invention, when the selection signal CS #transitions from a low logic level to a high logic level, the first enable signal EN1 transitions to a high logic level, and the timer 310 starts counting the counting time. When the counting time reaches the first target time, the timer 310 outputs the first enable signal EN1 being at the high logic level, so that the delay-locked loop 320 does not operate to reduce power consumption. In other words, when based the selection signal CS #being at the high logic level for the counting time, the electronic circuit 300 does not operate, which can help reduce power consumption.

Figure 4:
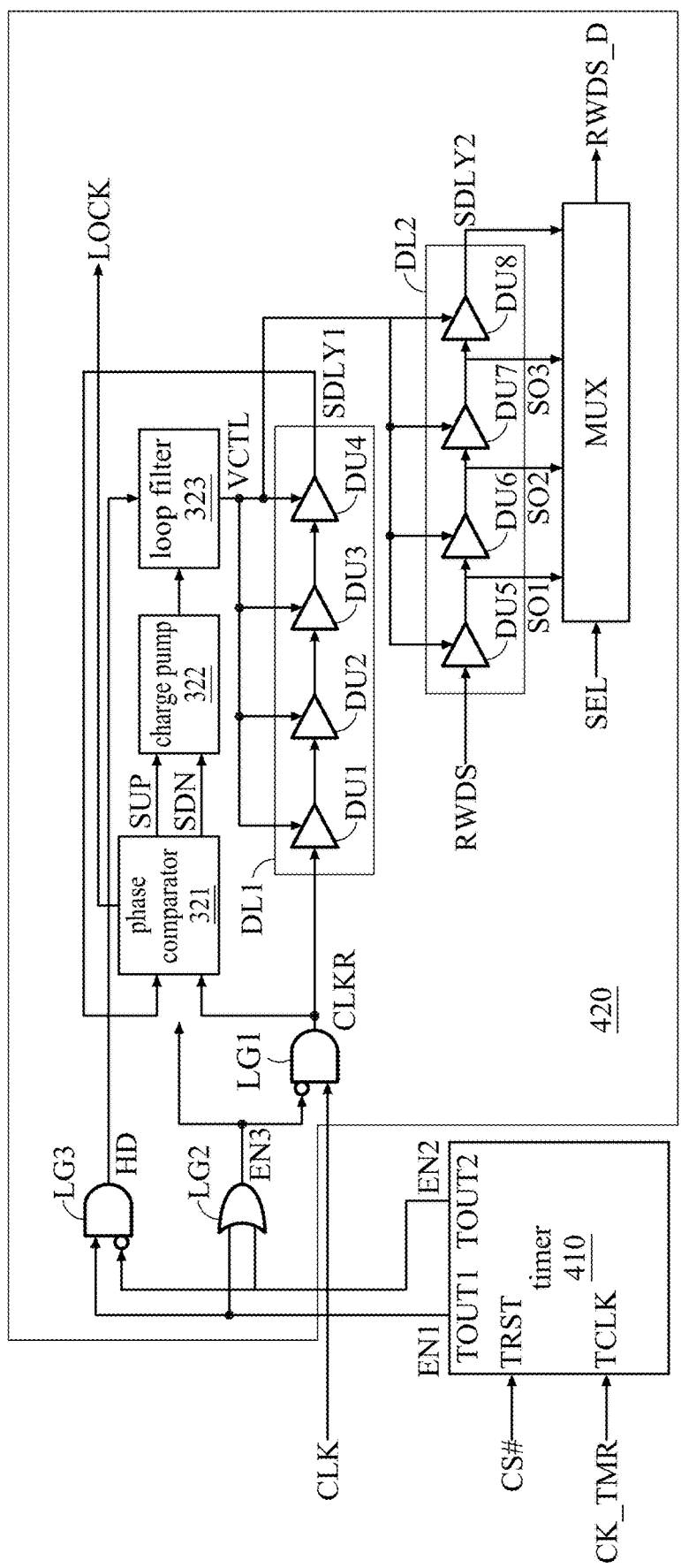
FIG. 4 is a schematic diagram showing an electronic circuit in accordance with another embodiment of the present invention.

FIG. 4 is a schematic diagram showing an electronic circuit in accordance with another embodiment of the present invention. According to another embodiment of the present invention, the electronic circuit 130 in FIG. 1 corresponds to the electronic circuit 400. Comparing the electronic circuit 400 in FIG. 4 with the electronic circuit 300 in FIG. 3, the electronic circuit 400 further includes a second logic unit LG2 and a third logic unit LG3, and the timer 410 further includes a second output terminal TOUT2 for outputting a second enable signal EN2. In addition, the delay-locked loop 420 in FIG. 4 is the same as the delay-locked loop 320 in FIG. 3 except for the loop filter 423. The details will be described in detail below.

According to an embodiment of the present invention, as shown in FIG. 2, when the selection signal CS #switches from a high logic level to a low logic level, the timer 410 resets the counting time to zero and sets the first enable signal EN1 and the second enable signal EN2 is set to the enable state (i.e., the low logic level in the embodiment of FIG. 4). The second logic unit LG2 performs a logic OR operation on the first enable signal EN1 and the second enable signal EN2 to generate a third enable signal EN3. The first logic unit LG1 outputs the clock signal CLK as the reference clock signal CLKR based the third enable signal EN3 in the enable state.

According to an embodiment of the present invention, when the selection signal CS #is at the low logic level, the electronic circuit 400 operates in the high power state, and both the first enable signal EN1 and the second enable signal EN2 are in the enable state (i.e., at the low logic level in the embodiment of FIG. 4). The second logic unit LG2 generates the third enable signal EN3 in the enable state based on the first enable signal EN1 and the second enable signal EN2 signal both being in the enable state, the first logic unit LG1 outputs the clock signal CLK as the reference clock signal CLKR based on the third enable signal EN3 in the enable state, and the third logic unit LG3 sets the hold signal HD in the turn-on state based on the first enable signal EN1 and the second enable signal EN2 and EN3. The delay-locked loop 420 operates in a high power state and delays the output clock signal RWDS to generate the delayed clock signal RWDS_D based on the third enable signal EN3 in the enable state and the reference clock signal CLKR. According to an embodiment of the present invention, the second logic unit LG2 is an OR gate herein.

As shown in FIG. 2, when the selection signal CS #transitions from a low logic level to a high logic level, the timer 410 starts counting the counting time. According to an embodiment of the present invention, before the counting time reaches the first target time, both the first enable signal EN1 and the second enable signal EN2 are in the enable state (i.e., the low logic level in the embodiment of FIG. 4), the second logic unit LG2 generates a third enable signal EN3 in the enable state based on the first enable signal EN1 and the second enable signal EN2, and the first logic unit LG1 outputs the clock signal CLK as the reference clock signal CLKR based on the third enable signal EN3 in the enable state. The third logic unit LG3 sets the hold signal HD in the turn-on state based on the first enable signal EN1 and the second enable signal EN2. The delay-locked loop 420, based on the third enable signal EN3 in the enable state and the reference clock signal CLKR, still operates in the high power state and delays the output clock signal RWDS to the delayed clock signal RWDS_D.

According to another embodiment of the present invention, when the counting time reaches the first target time, the timer 410 sets the first enable signal EN1 to a disable state (i.e., the high logic level in the embodiment of FIG. 4), the second logic unit LG2 generates the third enable signal EN3 in the disable state based on the first enable signal EN1 in the disable state, so that the first logic unit LG1 stops generating the reference clock signal CLKR, and the delay-locked loop 420 operates in the second low-power state. The power consumption of the delay-locked loop 420 operating in the second low-power state is between that in the high power state and that in the first low-power state.

When the delay-locked loop 420 operates in the second low-power state, the phase comparator 321 and the charge pump 322 are disabled. The third logic unit LG3 sets the hold signal HD to a turn-off state based on the first enable signal EN1 in the disable state. According to an embodiment of the present invention, the third logic unit LG3 is an AND gate herein. When the hold signal HD is in a turn-off state, the hold signal HD is at the high logic level. The loop filter 423 keeps the control voltage VCTL based on the hold signal HD in the turn-off state, so that the first delay chain DL1 does not operate and the second delay chain DL2 still keeps operating.

In other words, when the delay-locked loop 420 operates in the second low power state, except for the second delay chain DL2 still being enabled, other components of the delayed locked loop 420 are disabled to reduce power loss. According to some embodiments of the present invention, since the loop filter 423 keeps the control voltage VCTL in the second low power state for continuing to generate the second internal delay signal SDLY2, the delay-locked loop 420 can quickly recovers in the next enablement.

According to another embodiment of the present invention, when the counting time continues to count and reaches the second target time, the timer 410 also outputs the second enable signal EN2 in the disable state (i.e., it is the high logic level in the embodiment of FIG. 4), the third enable signal EN3 is still in a disable state, and the hold signal HD is converted to a turn-on state. According to an embodiment of the present invention, when the hold signal HD is in the turn-on state, the hold signal HD is at the low logic level. Therefore, the charge pump 322 discharges the control voltage VCTL, and the second delay chain DL2 does not operate, so that the delay-locked loop 420 does not operate at all in the first low power state. According to an embodiment of the present invention, the second target time exceeds the first target time.

According to some embodiments of the present invention, as shown in FIG. 2, when the selection signal CS #transitions from a low logic level to a high logic level, the timer 410 counts the counting time and the communication between the controller 110 and the memory array 120 is stopped, and the electronic circuit 400 operates in the first power state (i.e., the delay-locked loop 420 does not operate at all) or the second power state (i.e., only the second delay chain DL2 of the delay-locked loop 420 still operates) based on the counting time.

Figure 5:
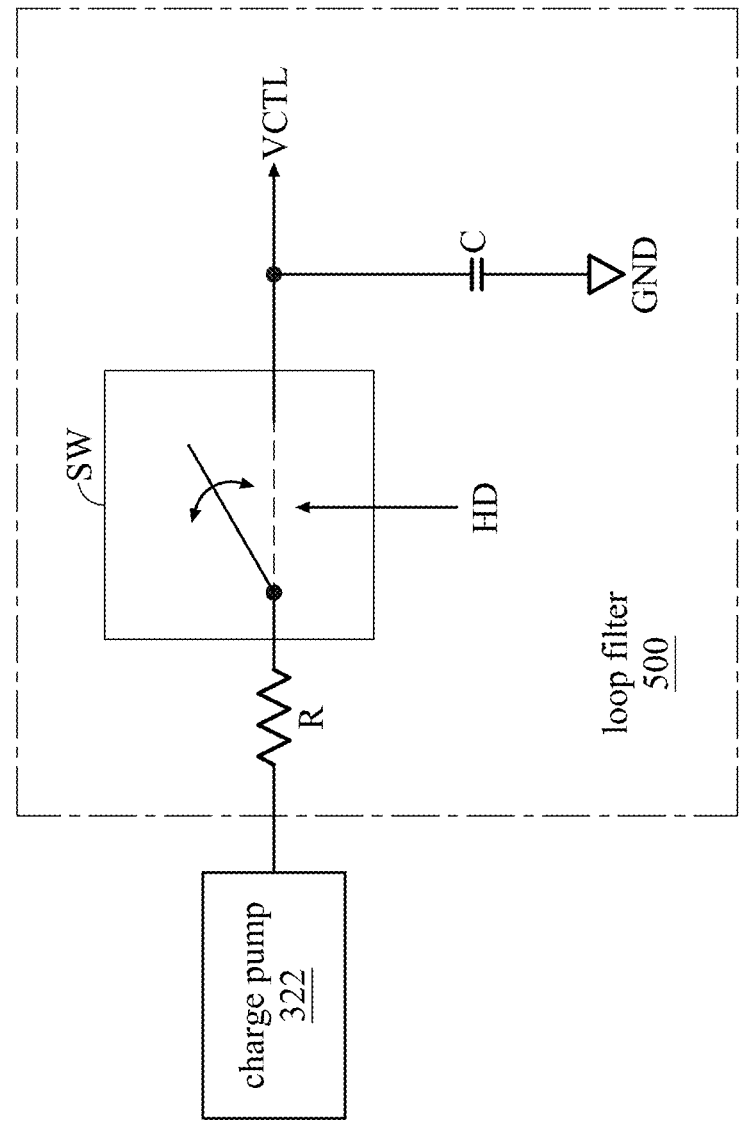
FIG. 5 is a circuit diagram showing a loop filter in accordance with an embodiment of the present invention.

FIG. 5 is a circuit diagram showing a loop filter in accordance with an embodiment of the present invention. According to an embodiment of the present invention, the loop filter 500 corresponds to the loop filter 423 in FIG. 4. As shown in FIG. 5, the loop filter 500 includes a resistor R, a capacitor C, and a switch SW. The resistor R is coupled to the charge pump 322, and the capacitor C is coupled between the resistor R and the ground terminal GND. The switch SW is coupled between the resistor R and the capacitor C, and is controlled to be turned on or turned off by the hold signal HD.

According to an embodiment of the present invention, when the hold signal HD is in the turn-on state, the switch SW is turned on, so that the charge pump 322 can charge and discharge the capacitor C through the resistor R and the switch SW so as to control the voltage level of the control voltage VCTL. According to another embodiment of the present invention, when the hold signal HD is in a turn-off state, the switch SW is in a turn-off state, and the capacitor C is electrically isolated from the charge pump 322 and configured to keep the voltage level of the control voltage VCTL.

In other words, when the hold signal HD is in the turn-on state, the switch SW is turned on, and the charge pump 322 charges and discharges the capacitor C through the resistor R. When the hold signal HD is in a turn-off state, the phase comparator 321 and the charge pump 322 are disabled, and the capacitor C is electrically isolated from the charge pump 322 to keep the voltage level of the control voltage VCTL, thereby keeping the delay time of the first delay chain DL1 and the second delay chain DL2 and shortening the recovery time for the electronic circuit 400 to resume the normal operation.

Figure 6:
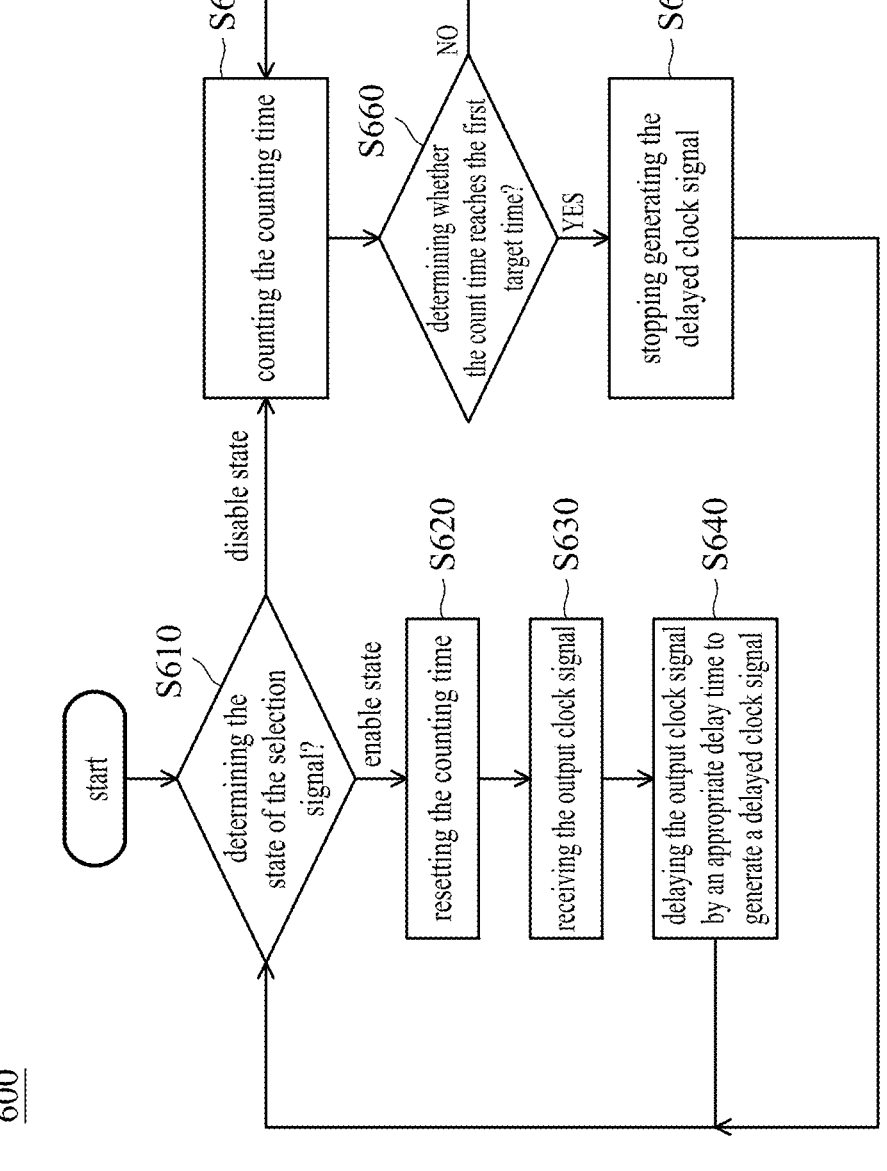
FIG. 6 is a flow chart showing a delay method in accordance with an embodiment of the present invention.

FIG. 6 is a flow chart showing a delay method in accordance with an embodiment of the present invention. The following description of the delay method 600 in FIG. 6 will be described in conjunction with the electronic circuit 300 in FIG. 3.

First, the electronic circuit 300 determines the state of the selection signal CS #(step S610). When the selection signal CS #is in the enable state (i.e., the low logic level shown in FIG. 2), the timer 310 resets the counting time (step S620). Next, the electronic circuit 300 receives the output clock signal RWDS from the memory array 120 (step S630). Subsequently, the electronic circuit 300 delays the output clock signal RWDS by an appropriate delay time based on the delay selection signal SEL of the controller 110 to generate a delayed clock signal RWDS_D (step S640), so that the starting points and the end points of the first data DT1, the second data DT2, the third data DT3, and the fourth data DT4 of the data signal DQ[7:0] received by the controller 110 are aligned with the rising edges and falling edges of the delayed clock signal RWDS_D respectively (as shown in FIG. 2).

Returning to step S610, when the selection signal CS #is in the disable state (i.e., the high logic level shown in FIG. 2), the timer 310 starts counting the counting time (step S650), and determines whether the count time reaches the first target time (step S660). When the counting time has not reached the first target time, the electronic circuit 300 operates normally (i.e., operates in the high power state), and the timer 310 continues to count the counting time (step S650).

According to some embodiments of the present invention, when the counting time has not reached the first target time, the electronic circuit 300 continues to generate the delayed clock signal RWDS_D. When the counting time reaches the first target time, the electronic circuit 300 stops generating the delayed clock signal RWDS_D (step S670) to operate in the first low power state, and returns to step S610 to continue monitoring changes in the selection signal CS #.

Figure 7:
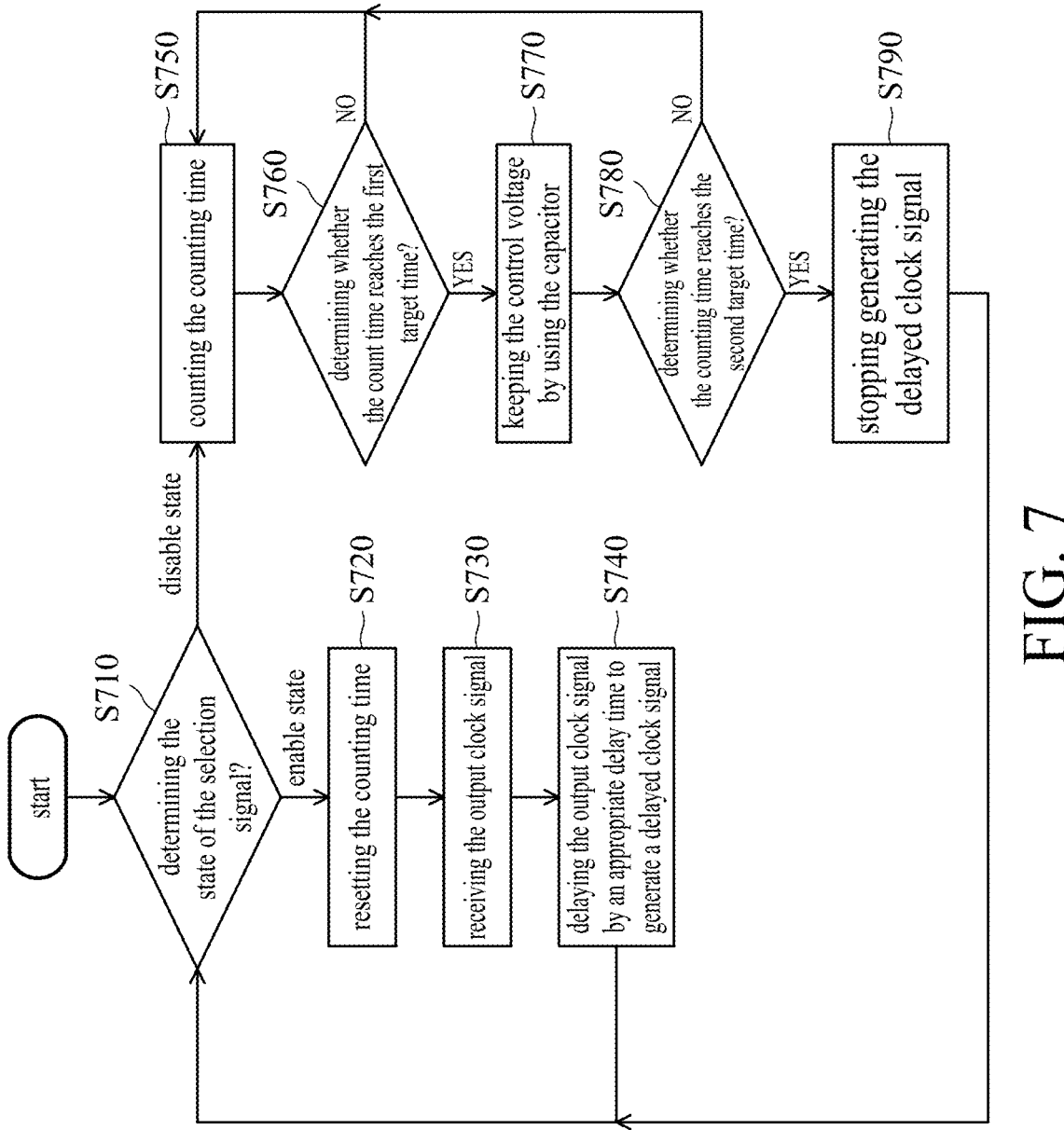
FIG. 7 is a flow chart showing a delay method in accordance with an embodiment of the present invention.

FIG. 7 is a flow chart showing a delay method in accordance with an embodiment of the present invention. The following description of the delay method 700 in FIG. 7 will be described in conjunction with the electronic circuit 400 in FIG. 4.

As shown in FIG. 7, steps S710 to step S760 are the same as step S610 to step S660 in FIG. 6, and will not be repeated herein. When it is determined in step S760 that the counting time reaches the first target time, the electronic circuit 400 operates in the second low-power state and uses the capacitor C of the loop filter 423 to keep the control voltage VCTL (step S770).

After step S770, the timer 410 of the electronic circuit 400 further determines whether the counting time reaches the second target time (step S780). When it is determined in step S780 that the counting time reaches the second target time, the electronic circuit 400 stops generating the delayed clock signal RWDS_D (step S790) to operate in the first low-power state, and returns to step S710 to continue monitoring changes of the selection signal CS #. When it is determined in step S780 that the counting time has not reached the second target time, the electronic circuit 400 returns to step S750 and continues to count the counting time.

According to some embodiments of the present invention, when the controller 110 receives the output clock signal RWDS and the data signal DQ[7:0] from the memory array 120 again in step S770, the controller 110 can controls the timer 410 to return to step S710 by the selection signal CS #, so that the electronic circuit 400 resets the counting time and returns to the normal operation to generate the delayed clock signal RWDS_D. Since the control voltage VCTL is maintained by the capacitor C, the recovery time of the electronic circuit 400 from the second low-power state to the normal operation is shortened.

Figure 8:
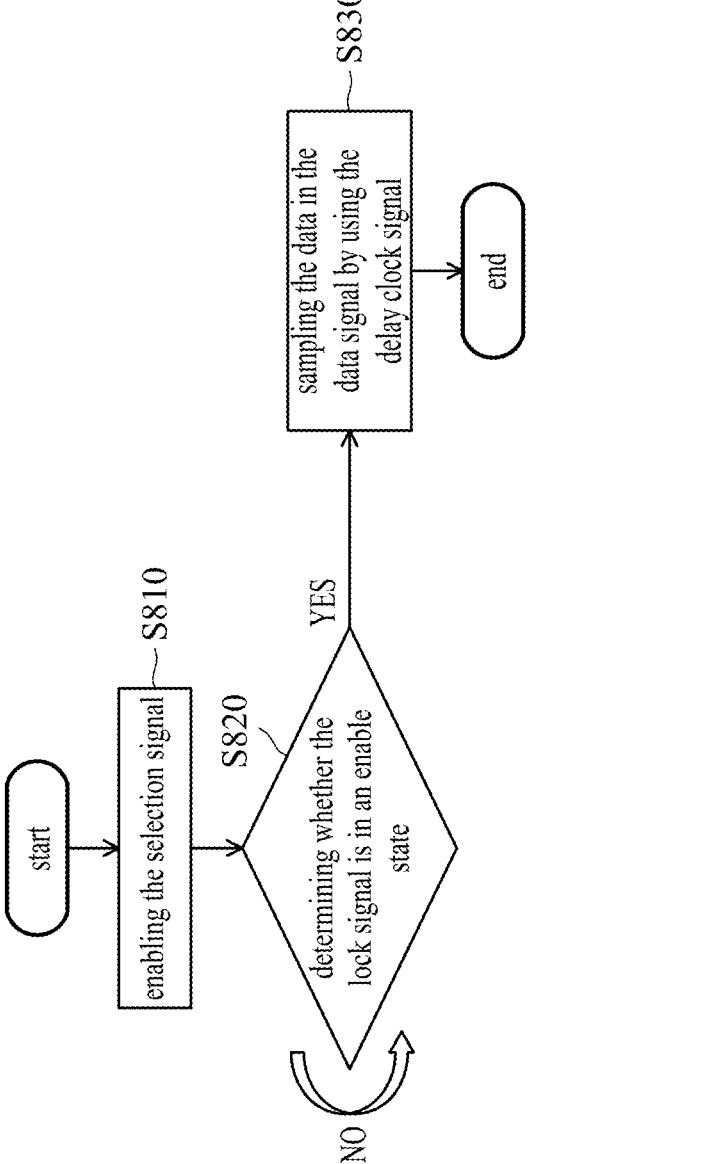
FIG. 8 is a flow chart showing a control method in accordance with an embodiment of the present invention.

FIG. 8 is a flow chart showing a control method in accordance with an embodiment of the present invention. The following description of the control method 800 will be described in conjunction with the electronic device 100 in FIG. 1.

First, the controller 110 enables the selection signal CS #(step S810), and determines whether the lock signal LOCK generated by the phase comparator 321 is in an enable state (step S820). According to an embodiment of the present invention, when the lock signal LOCK is in a disable state, it means that the electronic circuit 300 in FIG. 3 and the electronic circuit 400 in FIG. 4 have not completed the delay-locking, so the delay clock signal RWDS_D is not yet available. Therefore, when it is determined in step S820 that the lock signal LOCK is in the disable state, the controller 110 continues to determine whether the lock signal LOCK is in the enable state.

According to another embodiment of the present invention, when the lock signal LOCK is in the enable state, it means that the electronic circuit 300 in FIG. 3 and the electronic circuit 400 in FIG. 4 have completed the delay-locking, so the delay clock signal RWDS_D can be used. Therefore, when it is determined in step S820 that the lock signal LOCK is in the enable state, the controller 110 uses the delayed clock signal RWDS_D to sample the first data DT1, the second data DT2, and the third data DT3, and the fourth data DT4 in the data signal DQ[7:0] (step S830).

The present invention proposes an electronic circuit and a delay method. Through the electronic circuit and the delay method proposed by the present invention, the midpoint of the data signal of the memory array is aligned with the rising edge or the falling edge of the output clock signal (i.e., RWDS) to improve the accuracy of controller sampling. In addition, the electronic circuit and the delay method proposed by the present invention further count the counting time. When the electronic circuit times out, the electronic circuit enters a low-power state or even stops operating, thereby minimizing power loss as much as possible.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized based on the present disclosure. Accordingly, the appended claims are intended to include within their scope such processes, machines, manufacture, compositions of matter, means, methods, or steps.

What is claimed is:

1. An electronic circuit, applied to communication between a controller and a memory array, wherein the electronic circuit comprises:
   a timer, configured to count a counting time based on a selection signal generated by the controller to generate a first enable signal; and
   a delay-locked loop, configured to delay an output clock signal by a delay time based on a clock signal generated by the controller and the first enable signal, to generate the delay clock signal;
   wherein when the controller performs a read operation on the memory array, the memory array outputs the output clock signal and a data signal;
   wherein the controller samples the data signal based on the delay clock signal;
   wherein power-consuming states of the delay-locked loop are switched based on the first enable signal.

2. The electronic circuit as claimed in claim 1, wherein the delay-locked loop comprises:
   a first logic unit, configured to output the clock signal as a reference clock signal based on the first enable signal being in an enable state;
   a loop filter, configured to generate a control voltage;
   a charge pump, configured to charge and discharge the loop filter based on a control signal;
   a phase comparator, configured to compare phases of the reference clock signal and a first internal delay signal to generate the control signal; and a first delay chain, having a predetermined number of delay cells and delaying the reference clock signal based on the control voltage to generate the first internal delay signal.

3. The electronic circuit as claimed in claim 2, wherein the delay-locked loop comprises:

a second delay chain, having the predetermined number of delay cells and delaying the output clock signal by the delay time to generate a second internal delay signal; and a multiplexer, configured to select one of output signals output by the predetermined number of delay cells as the delay clock signal.

4. The electronic circuit as claimed in claim 3, wherein the first delay chain delays the reference clock signal by the delay time to generate the first internal delay signal;

wherein the reference clock signal has a cycle period;

wherein the delay time is equal to the cycle period.

5. The electronic circuit as claimed in claim 3, wherein when a phase of the reference clock signal is equal to a phase of the first internal delay signal, the phase comparator generates a lock signal;

wherein the controller determines, based on the lock signal, that the phase of the reference clock signal is equal to the phase of the first internal delay signal, and samples the data signal based on the delay clock signal.

6. The electronic circuit as claimed in claim 3, wherein when the first enable signal is in a disable state, the first logic unit does not output the reference clock signal;

wherein when the first enable signal is in the enable state, the first logic unit outputs the clock signal as the reference clock signal;

wherein the delay-locked loop operates in a high power state based on the first enable signal being in the enable state.

7. The electronic circuit as claimed in claim 6, wherein when the first enable signal is in the disable state, the delay-locked loop is not being powered;

wherein the delay-locked loop operates in a first low-power state based on the first enable signal being in the disable state;

wherein power consumption of the delay-locked loop operating in the high power state exceeds power consumption of the delay-locked loop operating in the first low-power state.

8. The electronic circuit as claimed in claim 3, wherein when the selection signal is transitioned from a first logic level to a second logic level, the communication between the controller and the memory array begins, the first enable signal is in the enable state, and the timer resets the counting time.

9. The electronic circuit as claimed in claim 8, wherein when the selection signal is transitioned from the second logic level to the first logic level, the timer begins counting the counting time;

wherein when the counting time reaches a first target time, the timer sets the first enable signal to be in the disable state;

wherein the delay-locked loop is disabled based on the first enable signal being in the disable state.

10. The electronic circuit as claimed in claim 9, wherein the timer further counts the counting time based on an additional clock signal.

11. The electronic circuit as claimed in claim 3, wherein the delay-locked loop comprises:

a second logic unit, configured to perform a logic operation on the first enable signal and a second enable signal to generate a third enable signal;

wherein the first logic unit further generates the reference clock signal based on the third enable signal.

12. The electronic circuit as claimed in claim 11, wherein when the first enable signal and the second enable signal are both in the enable state, the first logic unit outputs the clock signal as the reference clock signal;

wherein when the first enable signal or the second enable signal is in the disable state, the first logic unit does not output the reference clock signal.

13. The electronic circuit as claimed in claim 11, wherein the delay-locked loop comprises:

a third logic unit, configured to generate a hold signal based on the first enable signal and the second enable signal;

wherein when the first enable signal is in the disable state and the second enable signal is in an enable state, the hold signal is in a turn-off state;

wherein when the first enable signal and the second enable signal are both in the enable state or the disable state, the hold signal is in a turn-on state;

wherein the delay-locked loop operates in a second low-power state based on the hold signal being in the turn-off state;

wherein power consumption of the delay-locked loop operating in the second low-power state is between power consumption of delay-locked loop operating in the high power state and power consumption of the delay-locked loop operating in the first low-power state.

14. The electronic circuit as claimed in claim 13, wherein the loop filter comprises:

a resistor, coupled to the charge pump;

a capacitor, coupled between the control voltage and a ground; and a switch, coupled between the resistor and the capacitor and controlled by the hold signal.

15. The electronic circuit as claimed in claim 14, wherein when the hold signal is in the turn-off state, the switch is turned off and the capacitor is configured to hold the control voltage;

wherein when the hold signal is in the turn-on state, the switch is turned on.

16. A delay method applied to an electronic circuit, wherein the electronic circuit is applied to communication between a controller and a memory array, wherein the delay method comprises:

determining whether a selection signal is in an enable state or a disable state;

when the selection signal is in the enable state, receiving an output clock signal of the memory array; and delaying the output clock signal by a delay time to generate a delay clock signal using a delay-locked loop;

wherein data in a data signal is aligned with a rising edge or a falling edge of the delay clock signal;

wherein the controller samples the data signal based on the delay clock signal.

17. The delay method as claimed in claim 16, further comprising:

when the selection signal is in the disable state, counting a counting time;

determining whether the counting time reaches a first target time;

when the counting time reaches the first target time, stopping the output of the delay clock signal and continuing to determine whether the selection signal is in the enable state or the disable state; and when the counting time has not reached the first target time, continuing to count the counting time and continuing to delay the output clock signal by the delay time to generate the delay clock signal using the delay-locked loop.

18. The delay method as claimed in claim 17, further comprising:

resetting the counting time when the selection signal is in the enable state.

19. The delay method as claimed in claim 17, wherein the delay-locked loop further comprises a capacitor to store a control voltage;

wherein the delay-locked loop delays the output clock signal by the delay time to generate the delay clock signal based on the control voltage.

20. The delay method as claimed in claim 19, wherein the delay method further comprises:

when the counting time reaches the first target time, holding the control voltage by the capacitor to keep outputting the delay clock signal and to reduce power consumption; and when the counting time reaches a second target time, discharging the capacitor to stop outputting the delay clock signal;

wherein the second target time exceeds the first target time.

\* \* \* \* \*